(12) United States Patent
Witvrouw et al.

(10) Patent No.: US 7,557,027 B2
(45) Date of Patent: Jul. 7, 2009

(54) METHOD OF PRODUCING MICROCRYSTALLINE SILICON GERMANIUM SUITABLE FOR MICROMACHINING

(75) Inventors: Ann Witvrouw, Herent (BE); Maria Gromova, Leuven (BE); Marc Schaekers, Leuven (BE); Serge Vanhaelemeersch, Leuven (BE); Brenda Eyckens, Leuven (BE)

(73) Assignee: Interuniversitair Microelektronica Centrum, Leuven (BE)

( * ) Notice: Subject to any disclaimer, the term of this patent is extended or adjusted under 35 U.S.C. 154(b) by 383 days.

(21) Appl. No.: 11/338,080

(22) Filed: Jan. 24, 2006

(65) Prior Publication Data
US 2006/0166467 A1 Jul. 27, 2006

Related U.S. Application Data

(60) Provisional application No. 60/646,758, filed on Jan. 24, 2005, provisional application No. 60/700,899, filed on Jul. 19, 2005.

(51) Int. Cl.
| | |
|---|---|
| H01L 21/28 | (2006.01) |
| H01L 21/3205 | (2006.01) |
| H01L 21/20 | (2006.01) |
| H01L 21/36 | (2006.01) |
| H01L 29/06 | (2006.01) |

(52) U.S. Cl. .................. 438/602; 438/478; 438/485; 438/503; 257/19

(58) Field of Classification Search .............. 438/602, 438/479, 481, 483, 485, 192, 478, 300, 404, 438/503, 507; 257/19
See application file for complete search history.

(56) References Cited

U.S. PATENT DOCUMENTS

2005/0266693 A1* 12/2005 Maekawa ................ 438/720

OTHER PUBLICATIONS

Singh, Janak, et al, "Strain Sutdies in LPCVD Polysilicon For Surface Micromachined Devices," Elsevier Science S.A, 1999, pp. 133-138.
Witvrous, A., et al, "Why CMOS-Integrated Transducers? A Review," Microstem Technologies, 6 (2000), pp. 192-199.
"MuShield Design Guide", (Apr. 2006) pp. 10-11.
"Shielding AC Magnetic Fields," Field Management Services, (Apr. 2006) (htp://www.fms-corp.com/mitigation_shielding.php4).

* cited by examiner

*Primary Examiner*—Chuong Anh Luu
(74) *Attorney, Agent, or Firm*—McDonnell Boehnen Hulbert & Berghoff LLP

(57) ABSTRACT

A method of depositing a structural SiGe layer is presented. The structural SiGe layer may be located on top of a sacrificial layer above a substrate. The substrate may contain a semiconductor device such as a CMOS electronic circuit. The presented method uses a silicon source and a germanium source in a reaction zone to grow the structural SiGe layer. Hydrogen is introduced into the reaction zone and it may be used to dilute the silicon source and the germanium source. The resultant reaction occurs at temperatures below 450 degrees C., thereby preventing degradation of electronic device and/or other devices/materials located in the substrate.

20 Claims, 9 Drawing Sheets

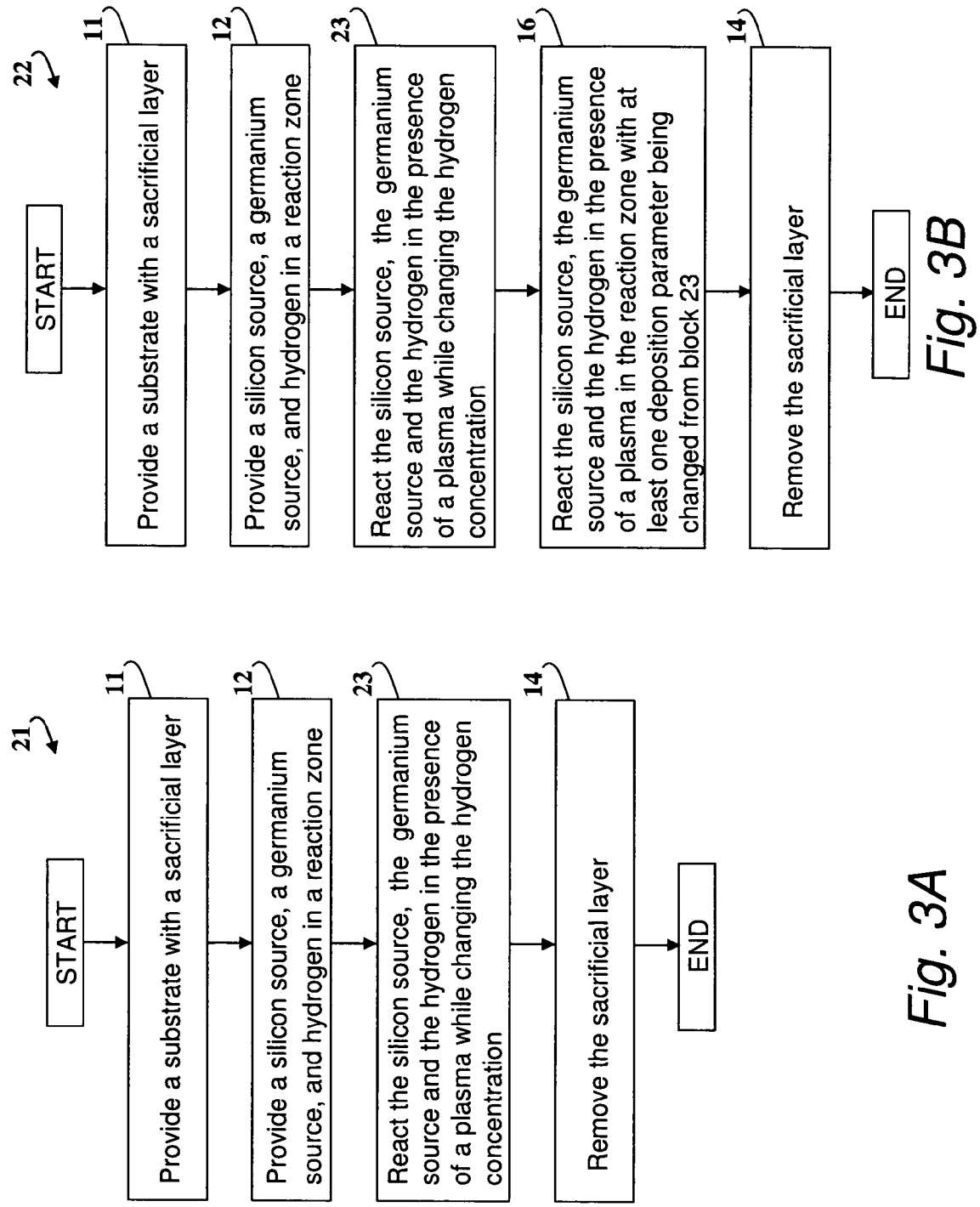

US 7,557,027 B2

METHOD OF PRODUCING MICROCYSTALLINE SILICON GERMANIUM SUITABLE FOR MICROMACHINING

PRIORITY

The present application claims priority to the following U.S. filed provisional patent applications: U.S. 60/646,758 filed Jan. 24, 2005 and U.S. 60/700,899 filed Jul. 19, 2005 which are both incorporated herein by reference.

FIELD

The invention is related to methods to obtain as-deposited, low-stress and low resistivity microcrystalline SiGe layers as well as semiconductor devices comprising such SiGe layers. These layers may be used in Micro Electro-Mechanical Systems (MEMS) devices or other micro-machined structures, for example.

BACKGROUND

Micro Electro Mechanical Systems (MEMS) are used in a wide variety of systems such as accelerometers, gyroscopes, infrared detectors, micro turbines, etc. For high volume applications, fabrication costs may be reduced by monolithic integration of MEMS along with the Complimentary Metal Oxide Semiconductor (CMOS) electronics that are used to drive or control them (driving electronics). In addition, for 2D imaging applications (e.g. detectors, displays), monolithic integration of MEMS and CMOS processing may be advantageous as this simplifies interconnection issues.

An easy approach for monolithic integration is post-processing MEMS on top of driving electronics, as this does not introduce any change into the standard fabrication processes that are used to fabricate the driving electronics. It also allows the realization of a more compact micro-system. This may not be possible if the MEMS-device is produced prior to the formation of the driving electronics. Unfortunately, post processing imposes an upper limit on the fabrication temperature of MEMS to avoid any damage or degradation in the performance of the driving electronics. This upper limit is typically about 450° C. An overview of several approaches with respect to the integration of driving electronics and MEMS devices may be found in "Why CMOS-integrated transducers? A review", *Microsystem Technologies*, Vol. 6 (5), p 192-199, 2000, by A. Witvrouw et al.

For many micromachined devices, such as transducers and other freestanding structures, the mechanical properties of the applied thin films may be critical to their success. For example, stress or stress gradients can cause freestanding thin-film structures to warp to the point that these structures become useless. Such thin film layers have ideally a low stress and a zero stress gradient. If the stress is compressive (often denoted by a minus-sign (−)), structures may buckle. If the stress is tensile (often denoted by a plus-sign (+)), structures may break. If the stress gradient is too compressive or tensile, microstructures may deform. For example, cantilevers may bow or under too compressive or tensile a stress.

Polycrystalline silicon (poly Si) has been widely used for MEMS applications. The main disadvantage of this material is that it requires high processing temperatures (above 800° C.) which are above the upper limit described above. These high temperatures are used to achieve the desired physical properties of a MEMS device One such physical property in particular being stress as explained above, and further in "Strain studies in LPCVD polysilicon for surface micromachined devices," Sensors and Actuators A (physical), A77 (2), p. 133-8 (1999), by J. Singh S. Chandra et al. This incompatibility of processing temperatures means that poly Si MEMS applications cannot be used for integration with CMOS if a CMOS device is processed before a MEMS device.

Polycrystalline silicon germanium (poly SiGe) is known in the art as an alternative to poly Si as they share similar properties. The presence of germanium reduces the melting point of the silicon germanium alloy and hence the desired physical properties may be realized at lower temperatures, allowing the growth on top of a standard CMOS device. Depending on the germanium concentration and the deposition pressure, the transition temperature from amorphous to polycrystalline may be reduced to 450° C., or even lower, compared to 580° C. for CVD poly Si.

In order to use such a poly SiGe layer for a MEMS device (e.g., gyroscopes, accelerometers, micro-mirrors, resonators, etc.), which may be 0.3 µm to 12 µm thick, for example, requires a low-stress (<20 MPa compressive and <100 MPa tensile) and a low electrical resistivity poly SiGe layer. Another important consideration for industrial applicability is that such a poly SiGe layer should be produced with a relatively high deposition rate. In addition, a reasonably small variance of characteristics between different points on the wafer should be achieved.

Fast deposition methods such as PACVD (Plasma Assisted CVD) or PECVD (Plasma Enhanced CVD) having a typical deposition rate >100 nm/min, normally result in amorphous SiGe layers with high stress and high resistivity at temperatures compatible with CMOS (450 degrees C. or lower), for low germanium concentrations. Polycrystalline layers deposited with PECVD with low stress and low resistivity are described in WO 01/74708, but only at higher temperatures.

Slow deposition methods such as CVD (with typical deposition rates of about 5-15 nm/min) can give crystalline layers with low resistivity at 460 degrees C., but this is not an economical process in a single wafer tool for. For example, typical 10 µm thick layers require a long processing time In WO 01/74708, it is indicated that the CVD deposition of in-situ boron doped poly crystalline SiGe at lower temperature (around 400 degrees C.) is feasible if the Ge concentration is high enough (above 70%) and if the boron concentration is high enough (above $10^{19}/cm^3$). This high Ge concentration does not include the use of a Ge sacrificial layer. In addition, an additional anneal at 450 degrees C. was needed to optimize the mechanical properties of this layer.

The minimum temperature of 450 degrees C. for CVD layers and 550 degrees C. for PECVD layers excludes the possibility of post processing SiGe devices on top of advanced CMOS devices. These advanced CMOS devices may include low-permittivity (low-k) inter-metal dielectrics that have a limited thermal budget. Additionally, processing on top of other (low cost) substrates, such as multi-chip modules or even plastics, it may require SiGe deposition temperatures below 400 degrees C.

Currently, methods like metal-induced crystallization and pulsed laser annealing of SiGe films are under development. However they require a deposition of a seed layer and/or special treatment of the deposited SiGe film in order to achieve the required properties. Therefore, there is a need for a SiGe film that facilitates the integration of CMOS and advanced CMOS devices with micromachined/MEMS devices.

SUMMARY

An example method of producing a polycrystalline structural SiGe layer, suitable for MEMS applications, on a substrate is presented. A substrate located below such a SiGe layer may contain a semiconductor or CMOS device. In addition, a semiconductor device such as a MEMS or a micromachined device may be formed in the SiGe layer. Such a MEMS device may be processed on top of the substrate. The disclosed structural SiGe layer has a predetermined average internal stress such that it is adapted for use as a structural layer.

The method of manufacturing such a SiGe layer includes the steps of: providing a substrate with a sacrificial layer; providing at least a silicon source and a germanium source in a reaction zone containing the substrate; providing hydrogen in the reaction zone containing the substrate; reacting the silicon source, the germanium source at least part of the reaction together with hydrogen in the presence of a plasma to deposit a silicon germanium layer on the sacrificial layer; and removing the sacrificial layer. The structural SiGe layer is formed using a ratio of [hydrogen]/[(silicon source)+(germanium source)] that is $\geqq 10$. This structural SiGe has, as a result of the above ratio, a predetermined average internal stress.

In a second example, the hydrogen may be provided during the entire reaction or only a portion of the reaction between the silicon source and the germanium source. In addition, the hydrogen may be gradually increased or decreased during such a reaction.

In a third example, the presented method may be used to create a SiGe layer having silicon concentrations in the region of 10-75% and/or 30-75%. Alternatively, the silicon content may be below below 40%, in particular below 35%. In another example, the silicon content in the SiGe layer is below 25%, in particular below 15%, below 10% or below 5%. In even further examples the silicon content in the SiGe layer is below 5% or can be zero.

In a fourth example, the reaction of the silicon source and the germanium source is carried out at a reaction zone pressure between 0.1 and 20 Torr or between 0.1 and 10 Torr. In one particular example, the reaction occurs at 1 Torr.

In a fifth example, the reaction zone is a deposition chamber. During the reaction between the silicon source and germanium source, the reaction zone includes a plasma. The plasma is generated by a RF power source at a RF power between 100 Watt and 700 Watt. In another example, the reaction zone is a PECVD deposition chamber. The reaction gases may be a variety of gases such as of silane ($SiH_4$), germane ($GeH_4$), diborane, phosphine, hydrogen ($H_2$) and combinations thereof. In one particular example a mixture of silane, germane, diborane, and hydrogen is used.

In a sixth example, a reaction parameter is adjusted after the growth of a first SiGe layer. A second SiGe layer (SiGe top layer) is grown. The adjusted parameter may be silicon concentration [proportional to the silicon source], germanium concentration [proportional to the germanium source], deposition pressure, deposition temperature, and plasma power, for example.

In a seventh example, hydrogen is provided (which may be in the presence of a plasma) in the reaction zone after reacting the silicon source and the germanium source. The growth rate of a SiGe layer may be inhibited during such a step. The characteristics of each of SiGe layer or SiGe top layer may be determined by the silicon content, the deposition conditions (such as temperature, pressure, or source gases), the thickness of the layer and combinations thereof. Multiple SiGe layers may be created by reacting the silicon source and the germanium source multiple times. Each reaction may use different reaction parameters. A predetermined average internal stress may be achieved in such a manner.

These as well as other aspects and advantages will become apparent to those of ordinary skill in the art by reading the following detailed description, with reference where appropriate to the accompanying drawings. Further, it is understood that this summary is merely an example and is not intended to limit the scope of the claims.

FIGURES

Certain examples are described below in conjunction with the appended drawing figures, wherein like reference numerals refer to like elements in the various figures, and wherein:

FIGS. 1A-B are flow diagrams of a method of growing a SiGe layer;

FIG. 2 is a cross section of multiple SiGe layers using the method of FIG. 1B;

FIGS. 3A-B are additional flow diagrams of a method of growing a SiGe layer;

FIGS. 4A-B are additional flow diagrams of a method of growing a SiGe layer;

DESCRIPTION

Figure 1:
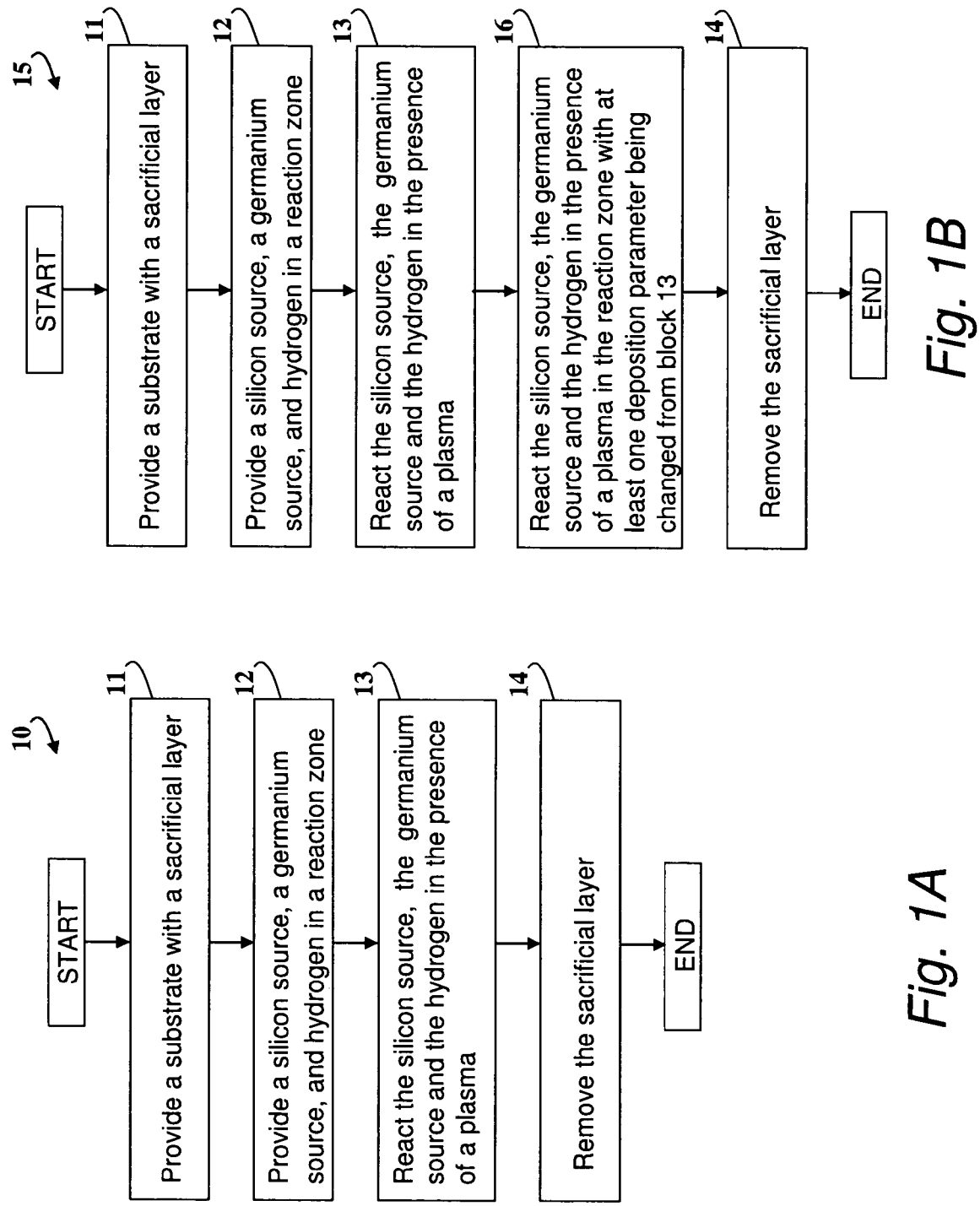

The present invention is described in detail below. It is apparent, however, that a person of ordinary skill in the art may envisage several other equivalent examples or other ways of executing the present invention that is within the spirit and scope of the present invention.

A polycrystalline or microcrystalline SiGe layer is deposited on top of a substrate (i.e., a substrate comprising semiconductor material) at a temperature compatible with underlying material that is comprised by the substrate. The underlying material may include at least one semiconductor device that has been manufactured in a CMOS process, for example. In the described examples below, the "substrate" may include any underlying material or materials that may be used, contained within the substrate, or upon which a device such as a MEMS device (that is mechanical, electronic, electrical, pneumatic, fluidic, etc.), a semiconductor component, a circuit, an epitaxial layer, or similar type of device and/or structure may be formed. In alternative examples, the "substrate" may include a semiconductor substrate such as doped or undoped silicon, gallium arsenide (GaAs), gallium arsenide phosphide (GaAsP), indium phosphide (InP), germanium (Ge), or silicon germanium (SiGe) substrate. The "substrate" may include for example, an insulating layer such as a silicon dioxide ($SiO_2$) or a silicon nitride ($Si_3N_4$) layer in addition to a non-insulating portion. The "substrate" also includes silicon-on-glass, or silicon-on-sapphire substrates. Thus, the term "substrate" is used to define generally the elements for layers that underlie a layer or portions of interest. In addition to the above examples, the "substrate" may be any other base on which a layer is formed, for example a glass substrate or a glass or metal layer.

Processing, as described below, will mainly be described with reference to processing on silicon substrates, however, those of ordinary skill in the art will appreciate that other examples may be implemented based on other semiconductor material systems and that the person of ordinary skill in the art can select suitable materials as equivalents, such as, for example, glass substrates.

Polycrystalline SiGe as defined herein is crystalline SiGe having an average grain size below 100 micrometer. Microcrystalline SiGe is defined herein as crystalline SiGe having an average grain size below 1 micrometer. A Microcrystalline SiGe layer may have a columnar crystal structure.

A MEMS or NEMS device, as described below may be any current or state of the art device. Examples of such devices are micro accelerometers, micro gyroscopes, micro tubes, vibration micro sensors, micro mirrors, micro mechanical resonators or "resonant strain gauges", micro mechanical filters, micro switches, micro electrical circuits, micro relays, Integrated Circuits with air gaps an the like.

The average internal stress as defined herein is the integral of the stress over the layer thickness divided by the layer thickness. Other terminology referred to such as stress, average stress, strain gradient are known in the art.

[product x] refers to the concentration of product x in the gas phase in the reaction zone (such as, but not limited hereto, the reaction chamber). For example, [hydrogen] refers to the concentration of hydrogen in the gas phase in the reaction chamber and [silicon source] refers to the concentration of the silicon source in the gas phase in the reaction chamber. When the term "silicon concentration" is used in the reactions step, the inventors refer to the concentration of silicon or silicon source in the gas phase in the reaction chamber. The same applies for hydrogen or germanium. When the term silicon content of silicon concentration is used with respect to the SiGe layer or SiGe top layer, this refers to the concentration or amount of Si in the deposited layer. The same applies for germanium or for a dopant.

An example method 10 of producing a polycrystalline structural SiGe layer, suitable for MEMS applications, on a substrate is presented in FIG. 1A. The structural SiGe layer has a predetermined average internal stress. Predetermined as described herein means that the stress value is such that the layer is adapted for use as a structural layer for MEMS applications. Additionally, the structural SiGe layer may be a microcrystalline SiGe layer, for example. The method includes providing a substrate with a sacrificial layer, as shown at block 11. As described above, a CMOS device may be located below the sacrificial layer. At block 12, a silicon source, such as silane gas, and a germanium source, such as germane, are provided in a reaction zone. Along with the silicon and germanium sources, the reaction zone contains the substrate. Additionally, the reaction zone may be a reaction chamber, for example.

At block 13, hydrogen is introduced into the reaction chamber. The concentration of hydrogen is higher than the concentration of the silicon source plus concentration of the germanium source. In even further examples, the ratio of hydrogen to the silicon and germanium source is greater than or equal to ten (concentration[hydrogen]/concentration[silicon source+germanium source] is $\geq 10$). The hydrogen should be provided in the reaction zone for at least part of the reaction between the silicon and germanium source as shown at block 12. In other examples, however, hydrogen is present in the reaction zone during the whole period of the reaction between the silicon source and the germanium source. At block 14, the sacrificial layer may be subsequently removed. Overall, the application of method 10 results in a structural SiGe layer having a predetermined average internal stress. The structural SiGe layer has a predetermined average internal stress for MEMS applications that is obtained by the cooperative effect of the deposition of the source gases, the presence of hydrogen, and the presence of a plasma.

In method 10, or any of the methods below, a nucleation layer may be provided between the substrate and the microcrystalline SiGe layer, but it is not needed. It should be noted that in some applications that the structural SiGe layer is not required to have a predetermined average internal stress. The growth rate of the SiGe layer using method 10 and those described below is selected such that a crystalline layer is formed. The growth rate can be determined by selection of the hydrogen concentration and the plasma. The presence of both the plasma and hydrogen during the reaction step is advantageous since this may result in an increase of the growth rate of the SiGe and improve the crystallization of the layer, thereby forming a polycrystalline layer with a predetermined average internal stress. In one example, the growth rate may be about 20 nm/min.

In another example, the hydrogen, introduced at block 13 may be viewed as a dilution gas. Block 13 generally refers to the reaction between the silicon source, the germanium source and the hydrogen in the presence of a plasma. The application of block 13 results in the deposition of a SiGe layer having a predetermined average internal stress. Upon completion of block 14, the resultant structural SiGe layer has an average internal stress that is preferably as low as possible.

The presence of high hydrogen concentration in the presence of a plasma is advantageous because it may result in a slow deposition of the SiGe layer, resulting in the formation of a polycrystalline or microcrystalline SiGe layer. The deposition rate of the SiGe layer is preferably between 10 nm/min and 300 nm/min. One advantage of method 10 and the methods described below is that a polycrystalline SiGe layer may be deposited at CMOS compatible temperatures (i.e., onto a semiconductor device layer which has been manufactured using CMOS processing). The CMOS back-end may also have Al or Cu metallization and oxide or low-k dielectrics.

In method 10 or the below described methods, a variety of gases for the silicon source, the germanium source, and the hydrogen may be used. For example, silane ($SiH_4$), germane ($GeH_4$), hydrogen ($H_2$), diborane, and combinations thereof may be used. In one example, the reaction gases are a mixture of silane ($SiH_4$), germane ($GeH_4$), hydrogen ($H_2$), and optionally diborane. The ratio of $[H_2]/([SiH_4]+[GeH_4])$ may decrease from 200 to 10 during the reacting step, for example. In another example, the ratio $[H_2]/([SiH_4]+[GeH_4])$ can decrease from 100 to 10, from 90 to 20, from 80 to 20, or from 80 to 30 during the reacting step. The hydrogen concentration is selected such that the desired degree of crystallinity is obtained. In some instances, the hydrogen concentration may be zero, for example.

In additional examples of the presented methods, a variety of substrates may be used. For example, the substrate temperature in the reaction zone may be below 450 degrees C.

All of the above reaction and processing parameters may result in a SiGe layer having a predetermined average internal stress that is characterized by an electrical resistivity between 5 mOhm·cm and 200 mOhm·cm or between 10 mOhm cm and 100 mOhm cm. Further examples of resultant SiGe layers, processing parameters, and reaction parameters are further described with reference to the Experiments section of this disclosure.

FIG. 1B illustrates another example method 15 of producing a polycrystalline structural SiGe layer. Method 15 includes the same blocks that are illustrated in FIG. 1A, but further comprises block 16. After the deposition of the SiGe layer using hydrogen as dilution gas (block 16) a second SiGe layer (also called SiGe top layer) is deposited using the silicon source, the germanium source, and hydrogen in the reaction zone. In this block, the silicon source, the germanium source, and the hydrogen may be adjusted or modified. Additionally, at block 16, at least one reaction parameter is adjusted (e.g., [silicon source] (or silicon concentration in the silicon source), [germanium source] (or germanium concentration in the germanium source), deposition pressure, deposition temperature, plasma power, etc.) so that it is different from an original reaction parameter used at block 13.

In yet another example, the amount of Si or Ge in the SiGe top layer may be different or equal to the amount of Si or Ge in the layer deposited at block 13 (i.e., the first SiGe layer). Preferably, the application of block 16 results in the formation of a SiGe top layer wherein concentration of Si is higher compared to the concentration of Si in the first SiGe layer formed at block 13. The application of block 13 and block 16 results in a SiGe layer having a predetermined average internal stress.

It is understood that a beneficial effect on the average internal stress and average internal stress gradient may be obtained by combining SiGe layers with high Ge content (such as the first SiGe formed at block 13) with a Si-rich SiGe top layer (such as the SiGe top layer formed at block 16).

Examples of Si content variation between the first SiGe layer and SiGe top layer include the Si content in the SiGe top layer being higher than 30%, higher than 40%, higher than 50%, or higher than 60%. In another example, the SiGe top layer has a silicon content between 30% and 75%, 45% and 75%, between 45% and 70%, or between 45% and 65%. Again, further examples are described in the Experiments section of this disclosure.

Figure 2:
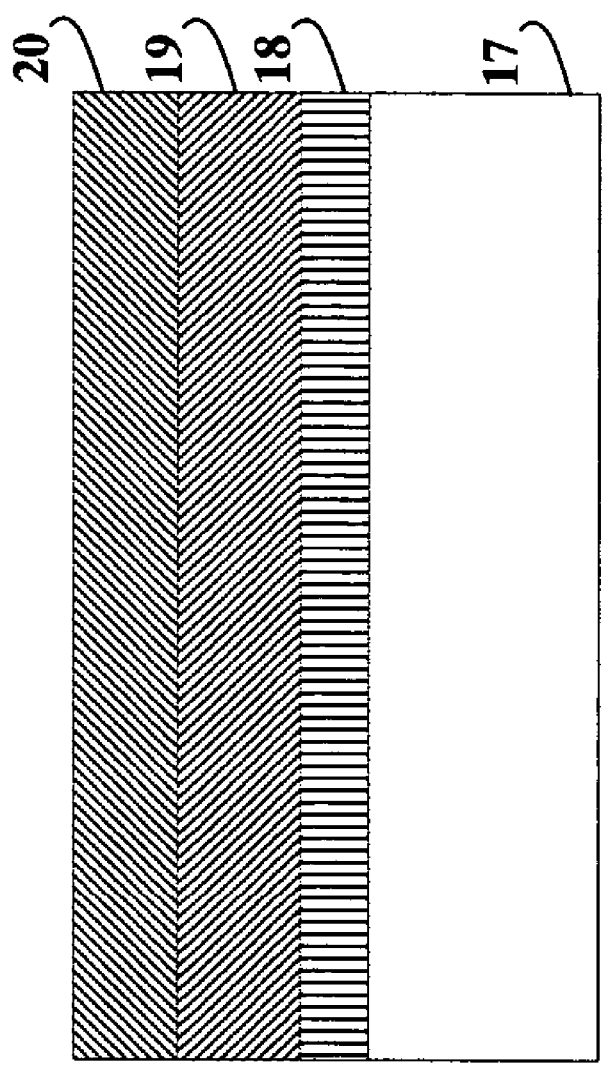

FIG. 2 illustrates SiGe layers created by the application of method 15 as described in FIG. 1B. A silicon substrate 17 is located below a sacrificial layer 18. A first SiGe layer 19 (formed at block 13) is located on top of sacrificial layer 18 and a SiGe top layer 20 is located on top of the first SiGe layer 19 (formed at block 16).

FIGS. 3A and 3B illustrate additional example methods of producing a polycrystalline structural SiGe layer. Methods 21 and 22 are similar to those illustrated in FIGS. 1A and 1B, however, block 13 is replaced with block 23. Instead, as shown at block 23 in both methods, the hydrogen concentration is changed during the reaction. During the deposition of the SiGe layer (block 23), the concentration of hydrogen is gradually changed (increased or decreased). In a preferred example, the hydrogen concentration is decreased.

It is believed that a gradual decrease in hydrogen dilution can lead to a gradual decrease in tensile stress with film thickness and thus allow the SiGe grown with reduced dilution to compensate for the positive strain gradient of the single films grown with constant hydrogen dilution. In actuality, a reduction in hydrogen dilution might even lead to more columnar grain growth than compared to single films as the positive strain gradient in single films is probably caused not only by the amorphous fraction often seen at the interface of a film, but also by some increase in grain size over the film thickness. An additional benefit of a variation in hydrogen dilution is that no variation in Ge content over the layer is expected, which may be important for the thermal stability of the SiGe films. What is more, the overall growth rate of the deposition process increases with reduced hydrogen dilution.

Another added benefit to decreasing hydrogen dilution by the end of the application of block 23 is that hydrogen etches away less energetically favorable bonds from a film surface, promoting the growth of a higher quality crystalline material, which increases the deposition rate. Therefore, reducing hydrogen dilution might have a two fold beneficial influence on the growth of the film: an increase of the deposition rate and the growth of more columnar grains (in contrast to V-shaped grains). It is further understood that a very high hydrogen dilution could be used in the beginning of the growth process, where nucleation has to be achieved and v-shaped grains start to grow. Afterwards, a reduced $H_2$ dilution may be used for 'tuning' the shape of the grains, restricting them to grow more columnar-like and therefore allowing the opportunity to tune the strain gradient.

Figure 4A:
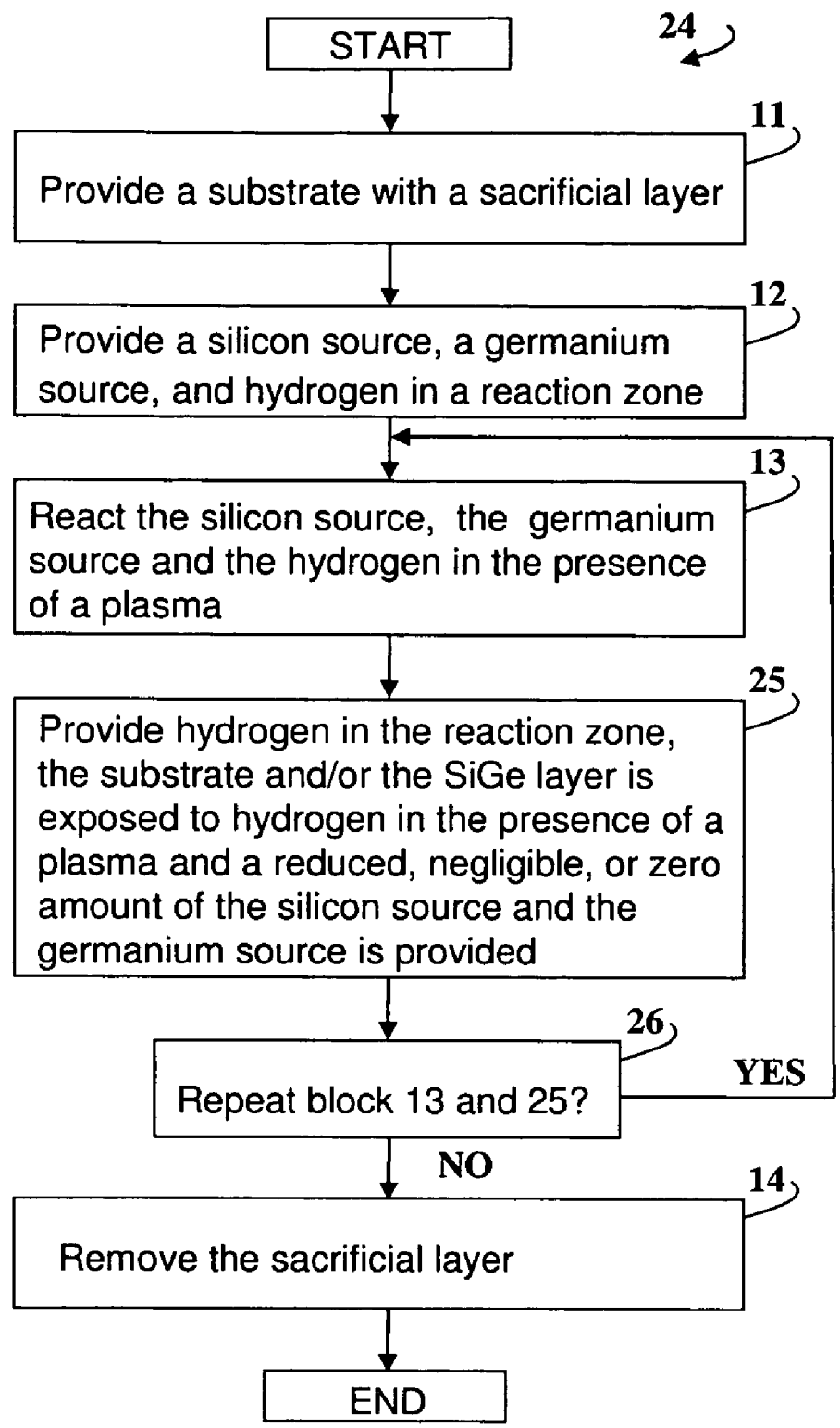

Shown in FIG. 4A is another example method 24. Steps 11-13 are similar to those described in methods 10, 15, 21, and 22. At block 25, however, the substrate and/or the SiGe layer is exposed to hydrogen in the presence of a plasma and not necessarily to the silicon source and the germanium source. "Not" meaning that the amount of silicon source or germanium is as low as possible and has no substantial effect during this step. Blocks 13 and 25 may be repeated n times (as shown at decision block 26, where n may be any integer. Example choices of n may be integers between 1 and 50, between 1 and 40, between 1 and 30, between 1 and 20, between 1 and 10, or between 1 and 5. A multilayer structure is formed by such an iteration. The result of the hydrogen dilution may be similar to the results achieved in the application of methods 21 and 22 of FIGS. 2A and 2B. In addition, during the application of block 25, hydrogen flow, pressure and/or RF power could be kept the same as they are during the application of block 13 or they could vary. Also, the duration of block 25 may also vary in relation to block 13. In a particular example, block 25 has a longer duration than block 13.

Figure 4B:
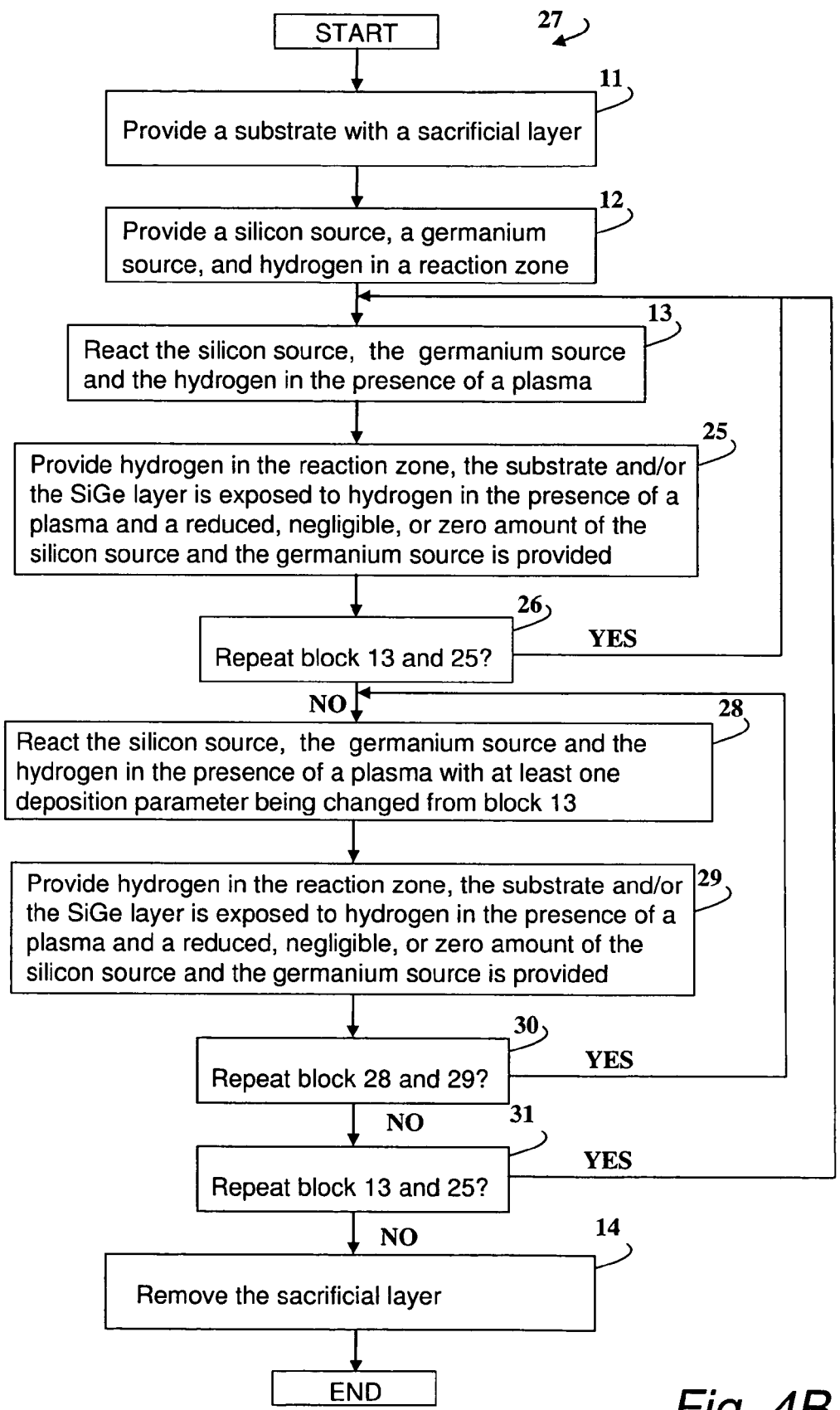

FIG. 4B is another example method 27 that may also be used to form a SiGe multilayer having a predetermined average internal stress. The method is similar to the method 14 illustrated in FIG. 4A. In FIG. 4B, however blocks 13, 25, and 26 are followed by blocks 28, 29, 30, and 31. Basically, method 27 is a combination of method 24 and 27. A second SiGe top may be formed using by repeating blocks 13, 25, and 26 which are respectively referred to as blocks 28, 29, and 30. However, in block 29 a layer (also called SiGe top layer) is deposited from a silicon source, a germanium source and hydrogen in the reaction zone in the presence of hydrogen. Again, and as described above, at block 28, the silicon source, the germanium source, and the hydrogen may be adjusted or modified. In addition at least one reaction parameter is adjusted (e.g., silicon concentration, deposition pressure, deposition temperature, plasma power, etc.) so that it is different from an original parameter used at block 13.

Again, a desired average internal stress and average internal stress gradient may be obtained by combining SiGe layers with high Ge content. In yet another example, the amount of Si or Ge in the SiGe top layer may be different or equal to the amount of Si or Ge in the layer deposited at block 13 (i.e., the first SiGe layer). Decision blocks 30 and 31 may be used to perform the above blocks a desired number of times.

Figure 5:
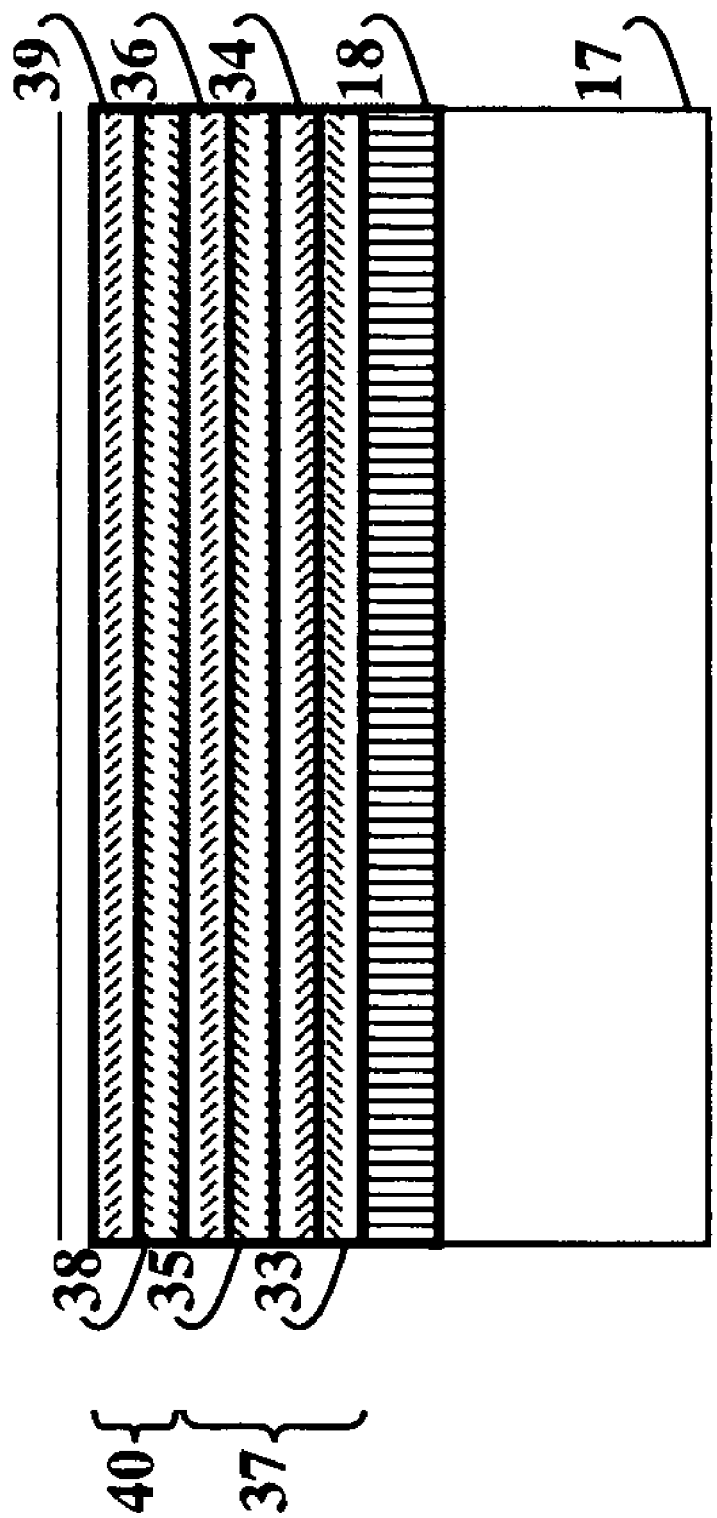
FIG. 5 is a cross section of multiple SiGe layers using the method of FIG. 4B.

FIG. 5 illustrates a device created by the application of method 27 as described in FIG. 4B. SiGe layer 33 is formed at block 13 and layer 34 is formed at block 25. Additional layers 35 and 36 are formed by repeating blocks 13 and 25. A multilayer SiGe structure 37 is the result. At blocks 28 and 29 respective layers 38 and 39 are formed resulting in multilayer 40. In the example of FIG. 5, blocks 28 and 29 are not repeated. It should be understood that a variety of the above methods may be used in combination with each other to produce a variety of SiGe layers.

Experiments

The following experiments describe a method for obtaining a layer of SiGe for MEMS applications. The SiGe is hydrogenated microcrystalline SiGe (μcSiGe:H). μcSiGe:H films with good electrical and mechanical properties are obtained in-situ at deposition temperatures between 300 and 400° C. For example, a μcSiGe:H film deposited at 400° C. substrate temperature, a low tensile stress of 25 MPa and a resistivity as low as 7-9 mΩ cm were achieved without the use of any seeding layer; such films are suitable for MEMS applications. These experiments reinforce that structural MEMS layers based on μcSiGe:H may be deposited at temperatures low enough to enable post-processing SiGe MEMS on top of advanced (Cu/low-k-based) CMOS generations.

Experimental Set-Up

Experiments 1-4: The SiGe films are deposited in an Oxford Plasma Technology (OPT) Plasma Lab 100 cold wall system, which is a standard parallel plate RF (13.56 MHz) Plasma Enhanced Chemical Vapor Deposition (PECVD) system. The reaction gases are a mixture of silane, germane, diborane, and hydrogen and are fed into the chamber from the top through an electrically isolated showerhead. The substrates used are (100) silicon wafers.

Experiment 5: The SiGe films are deposited in a CxZ camber mounted on an Applied Materials Centura Giga-Fill SACVD platform. It is a cold-wall, standard parallel plate RF (13.56 MHz) plasma enhanced chemical vapor deposition (PECVD) system. The reaction gases are a mixture of silane, germane, diborane and hydrogen and are fed into the chamber from the top through an electrically isolated showerhead. The substrates used are 8" (100) silicon wafers.

The average stress of the SiGe film is determined by measuring the bow of the wafer before and after the film deposition using an Eichorn and Hausmann MX 203 stressmeter. The sheet resistance is measured at different points over the wafer using a four-point probe. RBS is used to measure the Ge concentration in the film (max error of 10% is possible). The film thickness is measured on a patterned SiGe layer using a Dektak surface profiler. The SiGe layer is etched in an STS deep dry etching system, which uses an $SF_6+O_2/C_4F_8$ alternating plasma. A Wyko profilometer from Veeco is used to measure the deflection of 100 nm to 1 mm long and 25 or 50 μm wide cantilevers that are released using vapor HF. The deflection data is used to calculate the strain gradient in the film.

For the experiments described hereafter, the silicon source is silane ($SiH_4$), the germanium source is germane ($GeH_4$) while the boron source is $B_2H_6$. In particular experiments, $H_2$ is used as dilution gas.

Experiment 1

Layers of μcSiGe:H were grown at 1 Torr pressure and substrate temperatures between 300° C. and 400° C. RF power densities of 203 and 307 mW/cm² were used. The films are in-situ Boron-doped. The ratio $(SiH_4+GeH_4)/B_2H_6$ is 233. A hydrogen dilution ratio of $H_2/(SiH_4+GeH_4)=91$ was used. Deposition rates of 12-23 nm/min were obtained.

Different Ge concentrations are obtained by varying the silane to germane ratio. The Ge content of the as-deposited μcSiGe:H layers was investigated by means of RBS. Table 1 shows that electrical resistivities down to 75 mΩ·cm and 7 mΩ·cm were measured for layers deposited at substrate temperatures of 300° C. and 400° C. respectively.

Figure 6:
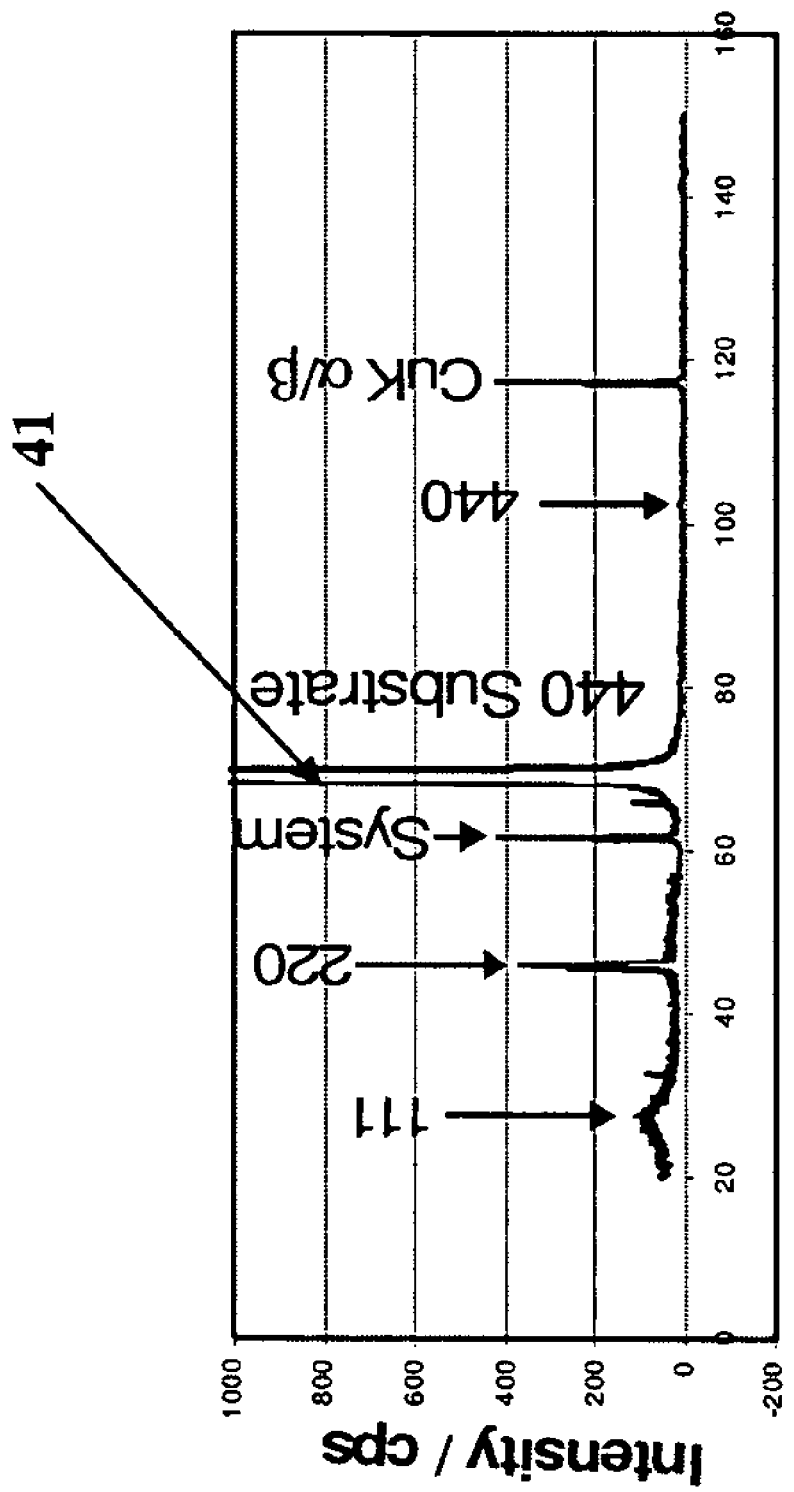
FIG. 6 is XRD pattern of $Si_{0.35}Ge_{0.65}$ film as deposited at 300° C.
Figure 7:
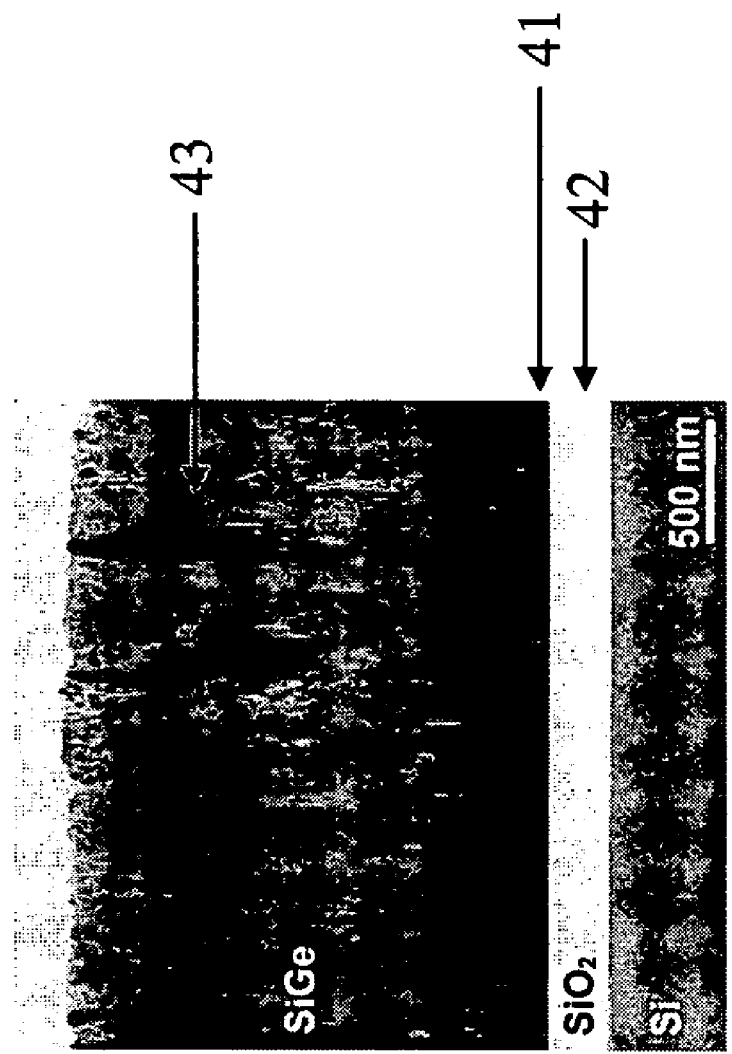
FIG. 7 is a cross section TEM of as-deposited μcSiGe:H at 400 degrees C.

The structure of the films was investigated by X-Ray Diffraction (XRD) and Transmission Electron Microscopy (TEM). The XRD data for a 2 μm thick film deposited at 300° C., shown in FIG. 6, clearly shows sharp peaks 41 indicating the crystallinity of the deposited material. The cross sectional TEM images, shown in FIG. 7, show a columnar crystal structure and a very smooth $SiO_2$ 42/SiGe 43 interface 44 for the layer deposited at 400° C.

Figure 8B:
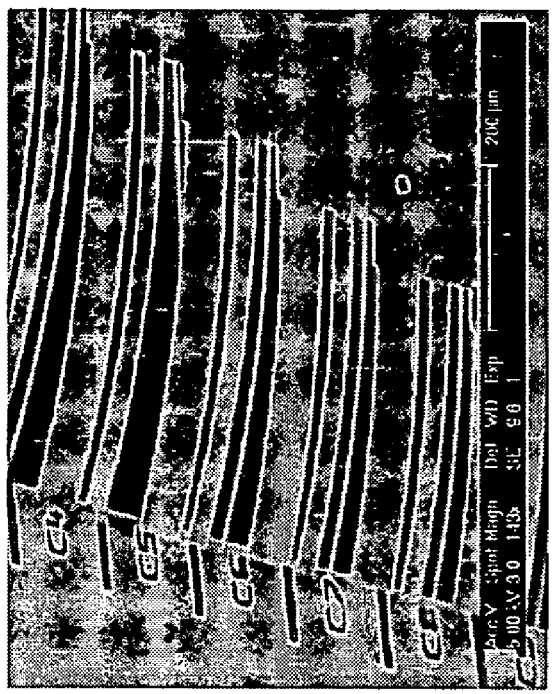
FIG. 8B is a SEM micrograph of 1.8 μm thick $Si_{0.52}Ge_{0.48}$, μcSiGe:H released cantilever.
Figure 8A:
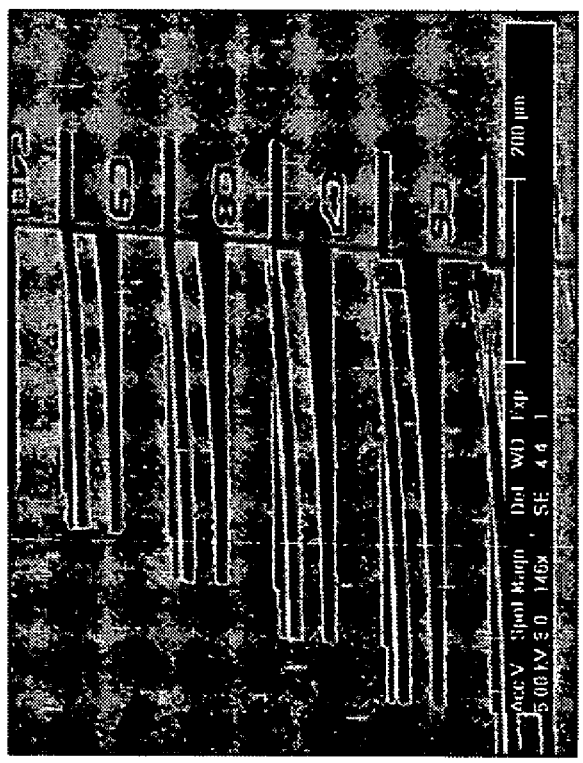
FIG. 8A is a SEM micrograph of a 2 μm thick $Si_{0.33}Ge_{0.67}$, μcSiGe:H released cantilever.

FIG. 8A illustrates a film deposited at 400° C. (see Table 1, condition 7) having a tensile stress of 25 MPa and the strain gradient is $2.86\times10^{-4}$ μm$^{-1}$. This film contains 67% Ge. In the case of a Si rich layer (48%Ge, 52% Si, see Table 1, condition 8), shown in FIG. 8B, a compressive stress is observed and the strain gradient is $6.3\times10^{-4}$ μm$^{-1}$. It is clear that the strain gradient in as-deposited films decreases with increasing Ge content.

TABLE 1

Properties of μc-SiGe deposited at 1 Torr and hydrogen dilution
$H_2/(SiH_4 + GeH_4) = 91$, $(SiH_4 + GeH_4)/B_2H_6 = 233$

| S. No | Temperature [° C.] | Power density [mW/cm²] | (SiH₄/GeH₄) | Thickness [μm] | Ge [%] | Deposition rate [nm/min] | Resistivity [mΩ · cm] | Stress, [MPa] |
|---|---|---|---|---|---|---|---|---|
| 1 | 300 | 203 | 1.8 | 2 | 65 | 17 | 75 | −175 |
| 2 | 350 | 203 | 1.8 | 1.9 | 70 | 16 | 18 | +2 |
| 3 | 400 | 203 | 1.8 | 2.2 | 65 | 18 | 16 | +46 |
| 4 | 400 | 203 | 4.3 | 1.5 | 52 | 12 | 18 | −186 |
| 5 | 400 | 203 | 2.3 | 1.7 | 70 | 14 | 10 | −40 |
| 6 | 400 | 203 | 1.5 | 2 | 67 | 17 | 7 | −9 |
| 7 | 400 | 370 | 1.8 | 2 | 67 | 23 | 9 | +25 |
| 8* | 400 | 370 | 3.6 | 1.8 | 48 | 20 | 11 | −32 |

*condition 8: $(SiH_4 + GeH_4)/B_2H_6 = 191$

Experiment 2

2 μm thick μcSiGe layers are deposited at 1 Torr pressure. The plasma power used is 370 mW/cm². Experiments were performed at 350° and 400° C. deposition temperatures. For the single films and the films with compressive top layer, a hydrogen dilution $(H_2/(SiH_4+GeH_4))$ of approximately 90 was used. The $H_2$ and $B_2H_6$ flows were kept constant throughout the deposition at 2 slm and 10 sccm respectively, while the SiH$_4$/GeH$_4$ was variable, determining the Ge content in the grown film. The stress of the μcSiGe layer is determined. The stress and strain gradient for films with different Ge content at two deposition temperatures are given in table 2. Similar as for the thin layers, the stress of the μcSiGe:H layers deposited both at 350° C. and 400° C. varies from compressive to tensile with increasing Ge content.

In an additional step to Experiment 2, a 0.3 μm thick Si$_{52}$Ge$_{48}$ top layer is deposited on top of the 2 μm thick Si$_{33}$Ge$_{67}$ layer. This results in a stress of +32 MPa, a resistivity of 12 mΩ cm and a train gradient of 1.5×10$^{-1}$ μm$^{-1}$ for deposition at 400° C. (see Table 3). The deposited bi-layer is crystalline. The same stack deposited at 350° C. leads to a compressive stress of 75 MPa, a resistivity of 13 mΩ cm and a strain gradient of 4×10$^{-4}$ μm$^{-1}$ (see Table 3).

TABLE 2

Properties of boron doped single μcSiGe:H layers deposited at 1 Torr, 370 mW/cm$^2$ power density and H$_2$/(SiH$_4$ + GeH$_4$) ≈ 90, layer thickness ~2 μm.

| Temperature (° C.) | Ge (%) | Deposition rate (nm/min) | Resistivity (mΩ cm) | Stress (Mpa) | Strain gradient (×10$^{-4}$ μm$^{-1}$) |
|---|---|---|---|---|---|
| 350 | 56 | 23 | 15 | +48 | 13.9 |
| 350 | 45 | 21 | 14 | -135 | 5 |
| 350 | 42 | 17 | 18 | -238 | 14 |
| 400 | 67 | 23 | 9 | +25 | 3 |
| 400 | 48 | 20 | 11 | -32 | 6.3 |

TABLE 3

Properties of 2 μm thick Si$_{33}$Ge$_{67}$ layer boron doped μcSiGe:H deposited at 1 Torr, 370 mW/cm$^2$ power density and a top layer (Si$_{52}$Ge$_{48}$) of different thickness.

| Temperature (° C.) | Si-rich layer thickness (μm) | Resistivity (mΩ cm) | Stress (Mpa) | Strain gradient (×10$^{-4}$ μm$^{-1}$) |
|---|---|---|---|---|
| 400 | 3 | 8 | +46 | Bend down |
| 400 | 1 | 11 | +28 | Bend down |
| 400 | 0.6 | 12 | +34 | — |
| 400 | 0.3 | 12 | +32 | 1.5 |
| 350 | 0.3 | 13 | -75 | 4 |

Experiment 3

Experiment 3, an overview of the performed experiments and the characteristics of the films are reported in Table 4.

Two different conditions were used as a basis: A) SiH$_4$/GeH$_4$=1.8 and B) SiH$_4$/GeH$_4$=1.3. Within these two base conditions the H$_2$ dilution was reduced in different steps. The first step is performed using a H$_2$ flow of 2 slm, leading to a dilution as high as 90 (condition A) or 76 (condition B). TEM analysis was done to acquire the necessary information on the microstructure. The grain microstructure through part of these layers is shown for condition A1 and for condition A3 can be described as follows : V-shaped grains are found at the beginning of the layer, which transform into elongated columnar grains within the thickness of the film.

For condition B1 (Table 4) a very low strain gradient of 3.6×10$^{-5}$ μm$^{-1}$ was measured.

TABLE 4

Properties of 'thin' (<1 μm) boron doped μcSiGe:H deposited at 350° C., 1 Torr, 370 mW/cm$^2$ power density and hydrogen dilution (H$_2$/SiH$_4$ + GeH$_4$)) decreasing during deposition.

| SiH$_4$/GeH$_4$ | CONDITION | H$_2$ dilution (H$_2$/SiH$_4$ + GeH$_4$) | Time in step (min) | Thickness (μm) | Deposition rate (nm/min) | Resistivity (mΩ cm) | Stress, (Mpa) |
|---|---|---|---|---|---|---|---|
| 1.8 | A1 | 90 | 10 | 0.7 | 28 | 32 | -35 |
|  |  | 68 | 5 |  |  |  |  |
|  |  | 46.5 | 5 |  |  |  |  |
|  |  | 25 | 5 |  |  |  |  |
|  | A2 | 90 | 10 | 0.53 | 26.5 | 27 | -45 |
|  |  | 46.5 | 10 |  |  |  |  |
|  | A3 | 90 | 10 | 0.64 | 25.6 | 21.8 | -32 |
|  |  | 79 | 5 |  |  |  |  |
|  |  | 68 | 5 |  |  |  |  |
|  |  | 46.5 | 5 |  |  |  |  |
| 1.3 | B1 | 76 | 5 | 0.7 | 34 | 59 | +29 |
|  |  | 61 | 5 |  |  |  |  |
|  |  | 42 | 5 |  |  |  |  |
|  |  | 23 | 5 |  |  |  |  |
|  | B2 | 76 | 5 | 0.8 | 39.5 | 274 | -19 |
|  |  | 42 | 5 |  |  |  |  |
|  |  | 23 | 5 |  |  |  |  |
|  |  | 14 | 5 |  |  |  |  |
|  | B3 | 76 | 5 | 0.6 | 29.5 | 48 | +53 |
|  |  | 70 | 5 |  |  |  |  |
|  |  | 61 | 5 |  |  |  |  |
|  |  | 42 | 5 |  |  |  |  |

Condition B1: strain gradient = 3.6 × 10$^{-5}$ μm$^{-1}$

Experiment 4

A bilyer, combining a layer of 2 μm $Si_{33}Ge_{67}$ film and a layer 1 μm $Si_{52}Ge_{48}$ film (see Table 1, conditions 7 and 8), was deposited at 400° C., 1 Torr pressure, 370 mW/cm² power density and a hydrogen dilution $H_2/(SiH_4+GeH_4)=91$. A 0.3 μm $Si_{52}Ge_{48}$ on top of 2 μm $Si_{33}Ge_{67}$ results in a positive strain gradient of $1.48 \times 10^{-4}$/μm. This shows the possibility to control the strain gradient in microcrystalline SiGe by using a multilayer deposition process. In the example they multilayer was built up out of layers with different Ge concentration. The individual layers of the multilayer might also be deposited with a different $H_2$ dilution.

Experiment 5

This experiment illustrates an example according to FIG. 3a. During the deposition step a SiGe layer is grown, different $SiH_4/GeH_4$ ratios are used depending on what Ge content of the film is desired. During the '$H_2$ plasma treatment' the SiGe layer deposited during the previous step undergoes a $H_2$ plasma treatment: the $H_2$ flow, pressure and RF power are kept the same as during the deposition step. Different total layer thicknesses can be obtained by varying the deposition time step and the number of the deposition step repetitions.

For example, the deposition conditions for depositing a 0.460 μm thick film with 135 MPa tensile stress and 55 mOhm cm resistivity, are given in table 2, condition 1. The layer was grown using 8 times a 30 seconds deposition step, alternated with a 300 seconds '$H_2$ plasma treatment' step after the first deposition step and 120 seconds '$H_2$ plasma treatment' steps after the second and each following deposition steps.

To optimize the strain gradient a compressive top layer can be used (as explained in detail in Experiment 2). An example of a 0.470 μm thick layer showing tensile stress of 52 MPa and resistivity of 88 mOhm cm. 7 deposition steps of 30 sec were performed to obtain the bulk layer containing ~65% Ge. The compressive top layer is formed by 1 deposition step of 30 seconds, the $SiH_4/GeF_4$ ratio is chosen such as to result in a layer of ~30% Ge content.

TABLE 5

Multilayer deposition at 400° C. wafer temperature (420° C. set point), pressure = 7 Torr, RF power = 200 W, using a $H_2$ flow of 2000 sccm both during the deposition and the $H_2$ plasma anneal step.

| Number | Deposition step | $H_2$ plasma treatment step | Resistivity, mOhm cm | Stress, MPa |
|---|---|---|---|---|
| 1 | Time = 30 sec, $SiH_4/GeH_4$ = 0.45 $B_2H_6$ = 20 sccm Number of steps = 8 | Time = 300 sec (after 1st deposition step) Time = 120 sec (after 2nd, etc. steps) | 55 | +135 |
| 2 | Bulk layer: Time = 30 sec $SiH_4/GeH_4$ = 0.45 $B_2H_6$ = 20 sccm Number of steps = 7 Top layer: Time = 30 sec $SiH_4/GeH_4$ = 3 $B_2H_6$ = 20 sccm Number of steps = 1 | Time = 300 sec (after 1st deposition step) Time = 120 sec (after 2nd, etc. steps) | 88 | +52 |

We claim

1. A method of forming a structural Silicon Germanium (SiGe) layer, the structural SiGe layer having a predetermined average internal stress, the method comprising:
   providing a substrate that includes a sacrificial layer;
   providing a silicon source and a germanium source in a reaction zone that contains the substrate, wherein the silicon source and germanium source together are at a first concentration;
   diluting the first concentration with hydrogen, wherein the hydrogen is at a second concentration that is at least ten times greater than the first concentration;
   reacting the silicon source and the germanium source, wherein the reacting is performed in the presence of a plasma so as to deposit the structural SiGe layer on top of the sacrificial layer; and
   removing the sacrificial layer.

2. The method as in claim 1, wherein a temperature associated with the substrate is below 420 degrees C. during reacting the silicon source and the germanium source.

3. The method as in claim 2, wherein the concentration of hydrogen is gradually changed during reacting the silicon source and the germanium source.

4. The method as in claim 1, wherein the concentration of hydrogen is gradually decreased during reacting the silicon source and the germanium source.

5. The method as in claim 1, wherein the structural SiGe layer has a silicon content that is between 30% and 75%.

6. The method as in claim 1 wherein reacting the silicon source and the germanium source is carried out at a pressure between 0.1 Torr and 20 Torr.

7. The method as in claim 1, wherein the reaction zone is a deposition chamber.

8. The method as in claim 1, wherein the plasma is generated by an RF power source at an RF power between 100 Watts and 700 Watts.

9. The method as in claim 1, wherein the silicon source is silane.

10. The method as in claim 1, wherein the germanium source is germane.

11. The method as in claim 1, wherein the reaction zone further comprises:
   providing a dopant source in the reaction zone; and
   reacting the dopant source with the silicon source and the germanium source.

12. The method as in claim 1, wherein a temperature associated with the reaction zone is below 400 degrees C.

13. The method as in claim 1, wherein a temperature associated with the reaction zone is about 400 degrees C.

14. The method as recited in claim 1, wherein the temperature in the reaction zone is below 350 degrees C.

15. The method as in claim 1, wherein the substrate includes a CMOS device.

16. The method as in claim 1, further comprising changing a reaction parameter associated with the reacting the silicon source and the germanium source so as to form a SiGe top layer on top of the structural SiGe layer.

17. The method as in claim 16, wherein the reaction parameter is selected from the group consisting of a silicon concentration associated with the silicon source, a germanium concentration associated with the germanium source, a deposition pressure, a deposition temperature, and a power associated with the plasma.

18. The method as in claim 17, wherein changing the parameter includes increasing the silicon concentration.

19. The method as in claim 1, further comprising subsequent to reacting the silicon source and the germanium source, providing hydrogen in the reaction zone and adjusting at least one of the germanium source and the silicon source, wherein a concentration associated with at least one of the silicon and the germanium source is at an amount that is selected from the group consisting of reduced, negligible, or zero.

20. The method as in claim 1, further comprising:
reacting the silicon source and the germanium source in the reaction zone so as to grow a second SiGe layer on top of the structural SiGe layer; and
subsequent to reacting the silicon source and the germanium source so as to grow the second SiGe layer, providing hydrogen in the reaction zone and adjusting at least one of the germanium source and the silicon source.

* * * * *